United States Patent
Iwadate et al.

(10) Patent No.: US 7,332,911 B2
(45) Date of Patent: Feb. 19, 2008

(54) MAGNETIC RESONANCE IMAGING APPARATUS

(75) Inventors: Yuji Iwadate, Tokyo (JP); Tetsuji Tsukamoto, Tokyo (JP)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 0 days.

(21) Appl. No.: 11/562,275

(22) Filed: Nov. 21, 2006

(65) Prior Publication Data

US 2007/0120565 A1 May 31, 2007

(30) Foreign Application Priority Data

Nov. 24, 2005 (JP) ............................. 2005-339016

(51) Int. Cl.
*G01V 3/00* (2006.01)
(52) U.S. Cl. ...................................... 324/318; 324/309
(58) Field of Classification Search ........ 324/300–322; 600/407–445
See application file for complete search history.

(56) References Cited

U.S. PATENT DOCUMENTS

| | | | |
|---|---|---|---|
| 4,994,744 A | 2/1991 | Glover et al. | |
| 5,159,550 A | 10/1992 | Sakamoto et al. | |
| 5,251,128 A | 10/1993 | Crawford | |
| 5,287,276 A | 2/1994 | Crawford et al. | |
| 5,382,902 A | 1/1995 | Taniguchi et al. | |
| 5,501,218 A | 3/1996 | Usui | |
| 5,923,770 A | 7/1999 | O'Donnell et al. | |
| 6,067,465 A | 5/2000 | Foo et al. | |
| 6,201,393 B1 | 3/2001 | Bernstein et al. | |
| 6,426,990 B1 | 7/2002 | Cesmeli | |
| 6,546,273 B2 | 4/2003 | Suzuki et al. | |
| 6,718,004 B2 | 4/2004 | Cesmeli | |
| 7,012,428 B1 | 3/2006 | Ward et al. | |
| 7,012,603 B2 | 3/2006 | Chen et al. | |
| 7,239,136 B2 * | 7/2007 | Sussman et al. | 324/307 |

FOREIGN PATENT DOCUMENTS

| | | |
|---|---|---|
| JP | 10-277010 | 10/1998 |
| JP | 2002-102201 | 4/2002 |

* cited by examiner

*Primary Examiner*—Brij Shrivastav
(74) *Attorney, Agent, or Firm*—Armstrong Teasdale LLP

(57) ABSTRACT

The present invention provides an MRI apparatus which prevents from developing body move artifacts on the image to improve the image quality. In the navigator sequence a scan unit emits first RF pulse so as to excite first slice plane area which is out of the imaging area and is intersecting the navigator area including the epiglottis, then it emits second RF pulse so as to excite second slice plane area which is out of the imaging area and is intersecting the first slice plane area in the navigator area including the epiglottis. Thereafter a body move detector detects the displacement of epiglottis due to the deglutition movement based on the navigator echo data, a raw data selector unit selects as raw data the imaging data thus obtained in the imaging sequence based on the displacement of epiglottis, then the image of the slice plane including the esophagus in the subject is generated from the imaging data thus selected.

8 Claims, 8 Drawing Sheets

MAGNETIC RESONANCE IMAGING APPARATUS

CROSS REFERENCE TO RELATED APPLICATIONS

This application claims the benefit of Japanese Application No. 2005-339016 filed Nov. 24, 2005.

BACKGROUND OF THE INVENTION

The present invention relates to a magnetic resonance imaging (MRI) apparatus, more specifically to generation of the image of a subject based on the magnetic resonance signal generated in the subject by emitting RF pulses to the subject in a static magnetic field space.

The MRI apparatus is widely used in many fields such as medical and industrial fields.

The MRI apparatus emits RF pulses to a subject in a static magnetic field space to excite the spin of protons within the subject by the nuclear magnetic resonance (NMR) phenomenon, then scans to obtain the magnetic resonance (MR) signals generated by the excited spin. The MR signals thus obtained by the scan are served as the raw data of a slice image, to generate the slice image of the subject (e.g., patent reference 1).

[patent reference 1] JP-A-2002-102201

When scanning an subject by using an MRI apparatus as have been described above, if the subject moves, the slice image generated may have some body move artifacts. For example, in case of the imaging of neck and esophagus of the subject, such body move as deglutition may cause the body move artifact, and decreases the image quality.

In order to prevent the decrease of the image quality due to the body move artifact, the subject is enforced to be externally tightened by fastening straps to suppress the body move while imaging is in operation.

However, there are cases in which the body move artifact develops in the slice image to decrease the image quality because the body move is not sufficiently suppressed.

In particular, since the internal body move within the body of the subject such as the epiglottis moving along with the deglutition is difficult to suppress by such means as a binding straps, the body move artifact may develop obviously in the slice image to significantly decrease the image quality.

SUMMARY OF THE INVENTION

An object of the present invention therefore is to provide an magnetic resonance imaging apparatus which allows improving the image quality by suppressing the development of body move artifacts.

In order to achieve the object described above the present invention provides an magnetic resonance imaging apparatus for generating an image of an subject based on the magnetic resonance signals developed in the subject by emitting RF pulses to the subject within a static magnetic field space, the magnetic resonance imaging apparatus comprises: a scanning unit for iteratively repeating an imaging sequence for obtaining as imaging data the magnetic resonance signals developed in an imaging area of the subject and a navigator sequence for obtaining as navigator echo data the magnetic resonance signals developed in a navigator area of the subject; a body move detector unit for repeatedly detecting the displacement due to the body move of the navigator area based on the navigator echo data obtained by performing the navigator sequence by the scanning unit; a raw data selector unit for selecting as raw data the imaging data obtained by performing the imaging sequence by the scanning unit based on the displacement due to the body move of the navigator area detected by the body move detector nit; and an image generator unit for generating an image of the subject based on the imaging data selected as raw data by the raw data selector unit, wherein the scanning unit performs the navigator sequence by emitting to the subject first RF pulse having a flip angle of 90 degrees so as to excite a first area including the navigator area, then by emitting second RF pulse having a flip angle of 180 degrees so as to excite a second area intersecting the first area in the navigator area.

In accordance with the present invention, a magnetic resonance imaging apparatus is provided which may improve the image quality by suppressing the development of body move artifacts.

Further objects and advantages of the present invention will be apparent from the following description of the preferred embodiments of the invention as illustrated in the accompanying drawings.

DETAILED DESCRIPTION OF THE INVENTION

Some preferred embodiments in accordance with the present invention will be described in greater details with reference to the accompanying drawings.

First Embodiment

From now on, a first preferred embodiment in accordance with the present invention will be described in greater details.

Figure 1:
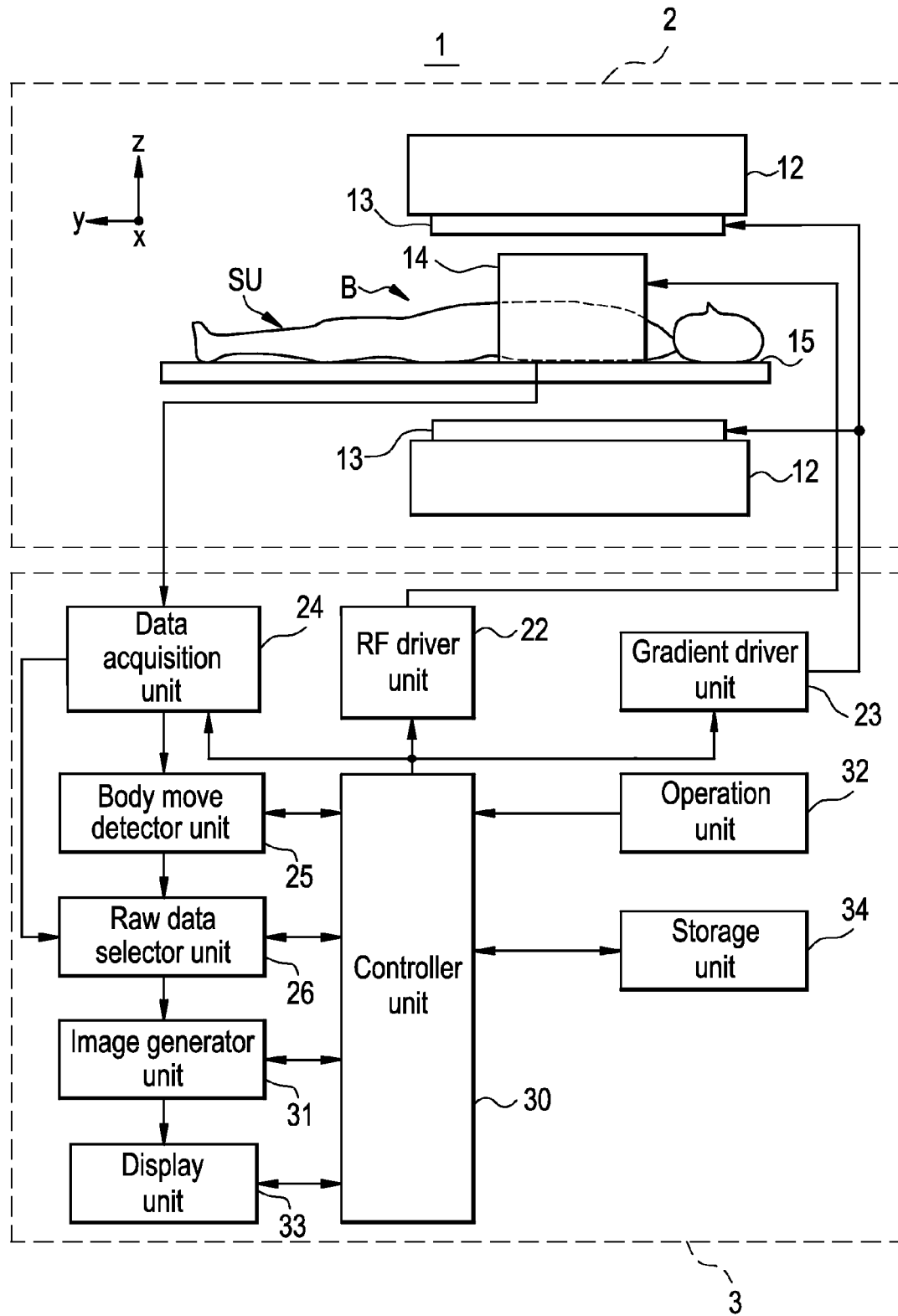
FIG. 1 is a schematic block diagram illustrating the overview of the magnetic resonance imaging apparatus 1 in accordance with first preferred embodiment of the present invention.

Now referring to FIG. 1, there is show a schematic block diagram illustrating the overview of a magnetic resonance imaging apparatus 1 in accordance with the preferred embodiment of the present invention.

As shown in FIG. 1, the magnetic resonance imaging apparatus 1 has a scan unit 2 and an operating console unit 3, and generates an image of an subject SU based on the magnetic resonance signals generated in the subject SU by emitting RF pulses to the subject in a static magnetic field space.

Now the scan unit 2 will be described in greater details.

The scan unit 2, as shown in FIG. 1, has a static field magnet unit 12, a gradient coil unit 13, an RF coil unit 14, and a cradle 15, and performs a scan to obtain the magnetic resonance signals developed in the subject SU, by emitting electromagnetic waves to the subject SU so as to excite the spin in the subject SU in an imaging space B having static magnetic field formed.

In this preferred embodiment, the scan unit 2 repeatedly performs the imaging sequence for obtaining as imaging data the magnetic resonance signals developed in the imaging area of the subject SU, and the navigator sequence for obtaining as navigator echo data the magnetic resonance signals developed in the navigator area of the subject SU.

More specifically, first, the scan unit 2 executes the imaging sequence for obtaining as imaging data the magnetic resonance signals from the imaging area of the subject SU for generating a slice image. Next, the scan unit 2 executes the navigator sequence for obtaining the navigator echo data from the navigator area including the epiglottis of the subject SU in order to monitor the deglutition movement of the subject SU. As will be described later in greater details, the scan unit 2, for performing the navigator sequence, emits to the subject SU a first RF pulse having the flip angle of 90 degrees so as to excite the first area that is out of the imaging area and intersects the navigator area, then emits to the subject SU a second RF pulse having the flip angle of 180 degrees so as to excite the second area that is out of the imaging area and intersects the first area in the navigator area.

The components of the scan unit 2 will be sequentially described in greater details.

The static field magnet unit 12 may be made of for example a pair of permanent magnets, which form static magnetic field in the imaging area B in which the subject SU is carried. The static field magnet unit 12 in this example forms the static field such that the direction of the static field extends along with the direction Z perpendicular to the body axis direction of the subject SU. The static field magnet unit 12 may also be made of superconductor magnets.

The gradient coil unit 13 forms a gradient field in the imaging area B in which the static field is formed, and adds the spatial positional information to the magnetic resonance signals received by the RF coil unit 14. In the preferred embodiment the gradient coil unit 13 is comprised of three systems of x-, y-, and z-direction, to form a gradient field for each direction in accordance with the imaging condition as frequency encode direction, phase encode direction, and slice selection direction. More specifically, the gradient coil unit 13 applies a gradient field in the slice selection direction of the subject SU, the RF coil unit 14 transmits an RF pulse to select the slice of the subject SU to be excited. The gradient coil unit 13 also applies a gradient field in the phase encode direction of the subject SU to phase encode the magnetic resonance signal from the slice excited by the RF pulse. Finally the gradient coil unit 13 applies a gradient field in the frequency encode direction of the subject SU to frequency encode the magnetic resonance signal from the slice excited by the RF pulse.

The RF coil unit 14, as shown in FIG. 1, is arranged so as to encompass the imaging area of the subject SU. The RF coil unit 14 forms a high frequency magnetic field by transmitting to the subject SU an RF pulse that is electromagnetic wave, in the imaging area B in which the static field magnet unit 12 forms a static magnetic field, in order to excite the spin of the protons within the imaging area of the subject SU. The RF coil unit 14 then receives the electromagnetic waves generated by the protons excited within the subject SU as magnetic resonance signals.

The cradle 15 incorporates a base for carrying the subject SU thereon. The cradle unit 26 moves in and out of the imaging area B based on the control signals from a controller unit 30.

The operating console unit 3 will be described now.

The operating console unit 3 has, as shown in FIG. 1, an RF driver unit 22, a gradient driver unit 23, a data acquisition unit 24, a body move detector unit 25, a raw data selector unit 26, the controller unit 30, an image generator unit 31, an operation unit 32, a display unit 33, and a storage unit 34.

The components of the operating console unit 3 will be described in greater details herein below.

The RF driver unit 22 drives the RF coil unit 14 to transmit RF pulses into the imaging area B to form a high frequency magnetic field. The RF driver unit 22 uses a gate modulator device to modulate the signals from the RF oscillator to signals that has a predetermined timing and a predetermined envelope, based on the control signals from the controller unit 30, the signal modulated by the gate modulator device is amplified by an RF power amplifier to output to the RF coil unit 14 in order to transmit RF pulses.

The gradient driver unit 23 applies a gradient pulse to the gradient coil unit 13 based on the control signals from the controller unit 30 to drive the gradient coil unit 13, thereby generating the gradient magnetic field in the imaging area B in which a static magnetic field is formed. The gradient driver unit 23 has three lines of driver circuits (not shown in the figure) each corresponding to one of three systems of gradient coil unit 13.

The data acquisition unit 24 acquires the magnetic resonance signals that the RF coil unit 14 receives, based on the control signals from the controller unit 30. The data acquisition unit 24 in the preferred embodiment uses the phase detector device to phase detect the magnetic resonance signals received by the RF coil unit 14 with the output from the RF oscillator of the RF driver unit 22 being as the reference signal. Then it uses an A/D converter to convert and output the magnetic resonance signals, which are analog signals, into digital signals.

In the present embodiment, the data acquisition unit 24 outputs the magnetic resonance signals obtained as the imaging data by the imaging sequence performed by the scan unit 2 to the raw data selector unit 26 of the operating console unit 3. The data acquisition unit 24 also outputs the magnetic resonance signals obtained as the navigator echo data by the navigator sequence performed by the scan unit 2 to the body move detector unit 25 of the operating console unit 3.

The body move detector unit 25 has a computer and a program for the computer to execute predetermined data processing, and it performs the data processing for detecting the displacement caused by the body movement of the subject SU while the scan unit 2 performs each imaging sequence.

In the present embodiment, the body move detector unit 25 detects the displacement after the scan unit 2 has performed the imaging sequence as the displacement caused by the deglutition movement of the subject SU. In this embodiment, the body move detector unit 25 repeatedly detects the displacement of the epiglottis moved along with the deglutition movement after the scan unit 2 has performed the imaging sequence based on the navigator echo data obtained by the scan unit 2 performing the navigator sequence.

The raw data selector unit 26 has a computer and a program for the computer to execute predetermined data processing, and performs the data processing for selecting the imaging data obtained by the scan unit 2 performing the imaging sequence as raw data based on the displacement due to the body move of the subject SU detected by the body move detector unit 25.

The raw data selector unit 26 in the present embodiment selects as raw data the imaging data obtained by the scanning based on the displacement of the subject SU caused by the deglutition movement detected by the body move detector unit 25 as have been described above. For example, the raw data selector unit 26 selects the imaging data as raw data when the displacement of epiglottis caused by the deglutition movement of the subject SU is fallen within a predefined allowable range at the time of obtaining the imaging data.

The controller unit 30 has a computer and a program executed by the computer to direct components to perform the predetermined operation in correspondence with the scanning, and it controls the components. The controller unit 30 has operation data input from the operation unit 32, to output control signals to control the predetermined scanning to the RF driver unit 22, the gradient driver unit 23, and the data acquisition unit 24 based on the operation data input from the operation unit 32, and to output control signals to control the body move detector unit 25, the image generator unit 31, the display unit 33 and the storage unit 34.

The image generator unit 31 has a computer and a program executed by the computer to perform predetermined data processing, and it reconstructs a slice image for the slice of the subject SU from the imaging data selected as the raw data by the raw data selector unit 26 based on the control signals from the controller unit 30. The image generator unit 31 then outputs thus generated image to the display unit 33.

The operation unit 32 is comprised of operating devices such as keyboard and pointing device. The operation unit 32 receives the operation data from the operator and outputs the operation data to the controller unit 30.

The display unit 33 is comprised of a display device such as CRT and displays an image on the display screen based on the control signals from the controller unit 30. For instance the display unit 33 displays on the display screen a plurality of images for the input items that the operator inputs the operation data through the operation unit 32. The display unit 33 also receives from the image generator unit 31 data of the slice images of the subject SU generated based on the magnetic resonance signals from the subject SU to display the slice image on the display screen.

The storage unit 34 is comprised of a memory, for storing various data. The storage unit 34 is accessed by the controller unit 30 for the stored data when required.

The operation of imaging the subject SU by using the magnetic resonance imaging apparatus 1 in accordance with the preferred embodiment of the present invention as have been described above will be described in greater details herein below.

Figure 2:
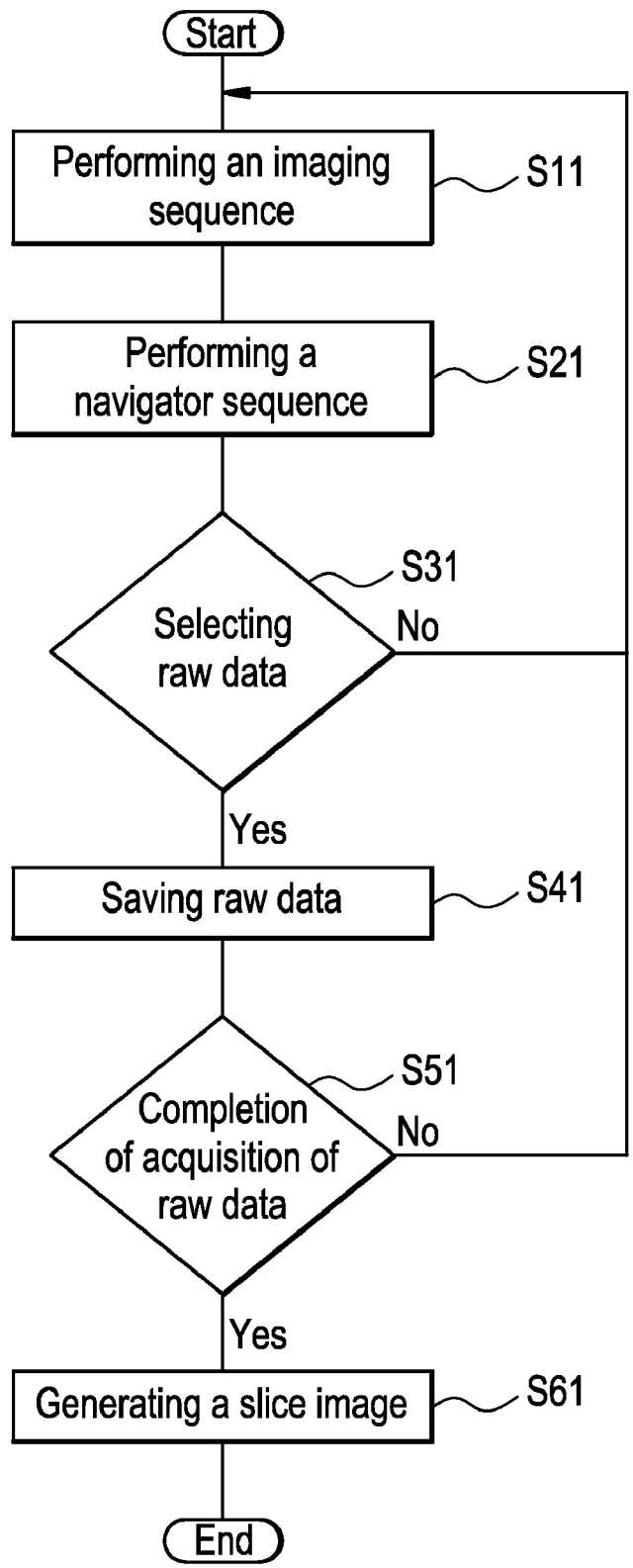
FIG. 2 is a schematic flow diagram illustrating the operation of imaging of subject SU in accordance with first preferred embodiment of the present invention.
Figure 3:
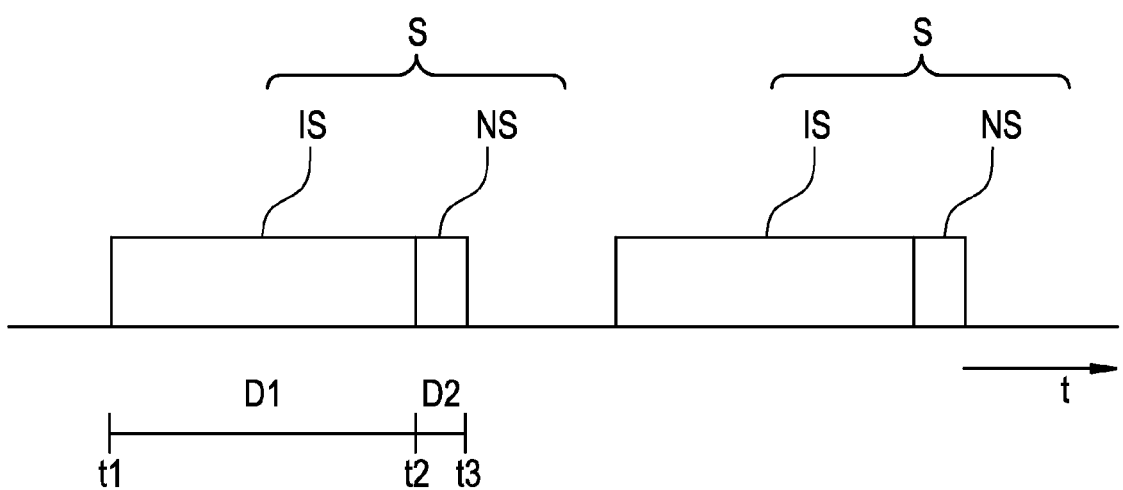
FIG. 3 is a schematic sequence diagram illustrating the sequence when scanning the subject SU in first preferred embodiment of the present invention, where the abscissa indicates the time axis t.

Now referring to FIG. 2, there is shown a schematic flow diagram illustrating the operation when imaging the subject SU. FIG. 3 is a sequence chart illustrating the sequence when scanning the subject SU, where the abscissa direction is the time axis t.

In the present embodiment scan S is performed for obtaining the slice image of the imaging area IA including the esophagus in the subject SU. When performing the scan S, the subject SU undergoes a localizer scan in advance, and the position of the subject SU will be adjusted based on the registration image obtained by the localizer scan. Then while a high speed imaging by means of the pulse sequence of the FGRE (fast gradient recalled echo) system images a picture of sagittal plane of the subject SU on the real time basis, the subject SU is instructed to intentionally perform deglutition movement in order to determine the position of epiglottis that moves during the deglutition movement, and to set the area including the epiglottis as the navigator area NA to monitor the deglutition movement.

When performing the scan S, as shown in FIG. 2 and FIG. 3, the imaging sequence IS will be performed (S11).

In this example the scan unit 2 performs the imaging sequence IS for obtaining the magnetic resonance signals as imaging data from the imaging area IA including the esophagus of the subject SU. For example, the scan unit 2 performs the imaging sequence IS in accordance with the gradient echo method. The imaging sequence IS is performed, as shown in FIG. 3, from the time point t1 where the imaging sequence IS starts, up to the time point t2 where a predetermined period of time D1 is elapsed. The data acquisition unit 24 acquires the magnetic resonance signals obtained as the imaging data by the imaging sequence IS to output to the raw data selector unit 26.

Then as shown in FIG. 2 and FIG. 3, the navigator sequence NS will be performed (S21).

In this example, in order to monitor the deglutition movement of the subject SU, the scan unit 2 performs in accordance with the spin echo method the navigator sequence NS to obtain the magnetic resonance signals as navigator echo data by selectively exciting the spin of the navigator area NA including the epiglottis. The navigator sequence NS, as shown in FIG. 3, is performed from the time point t2 where the imaging sequence IS is completed up to the time point t3 where a predetermined period of time D2 is elapsed.

Figure 4:
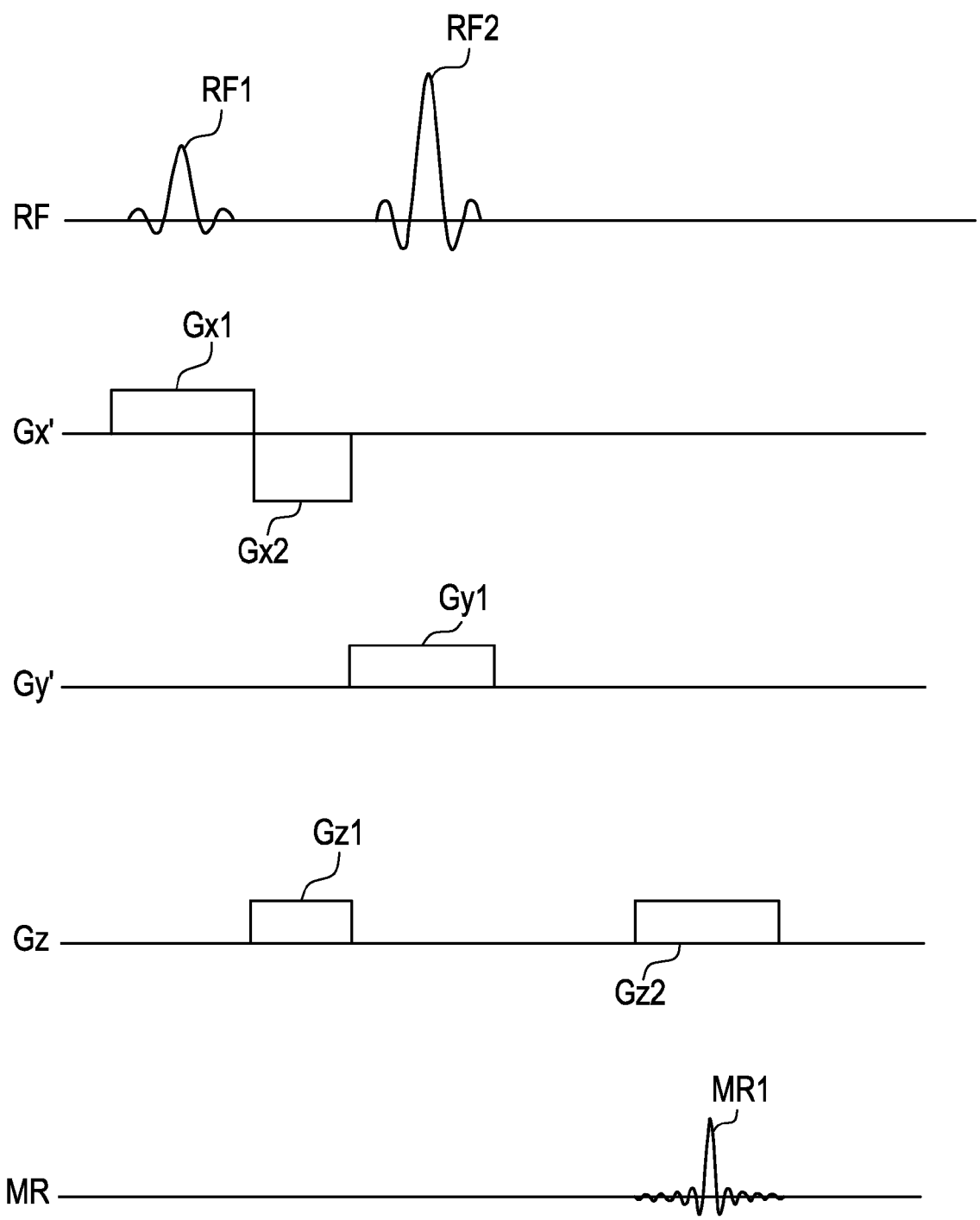
FIG. 4 is a schematic pulse sequence diagram illustrating the navigator sequence NS in first preferred embodiment of the present invention.

Now referring to FIG. 4, there is shown a pulse sequence diagram illustrating the navigator sequence NS. In FIG. 4, there are shown the RF pulse RF, gradient magnetic field Gx' in x' direction, gradient magnetic field Gz in z direction, gradient magnetic field Gy' in y' direction. In the figure the ordinate axis indicates the intensity, and the abscissa axis indicates the time.

Figure 5:
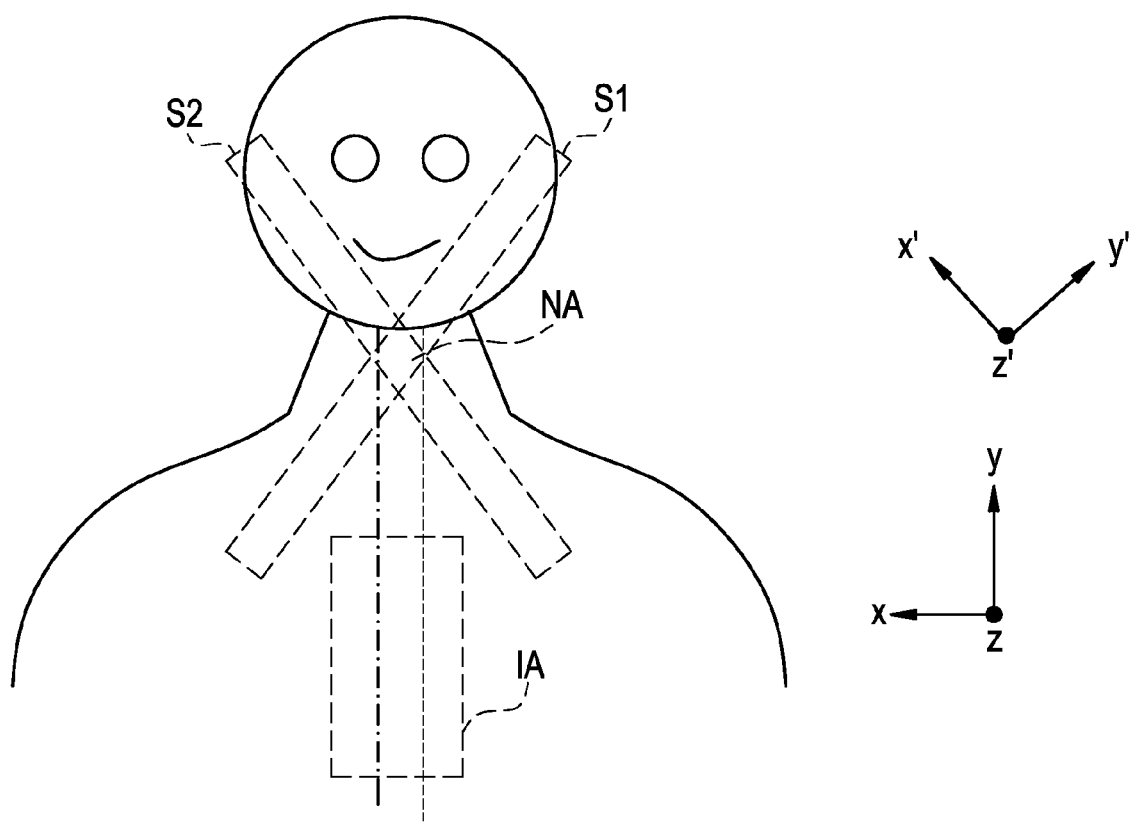
FIG. 5 is a schematic diagram illustrating the operation of the navigator sequence NS of the subject SU in first preferred embodiment of the present invention.

FIG. 5 shows a schematic diagram illustrating the navigator sequence NS on the subject SU.

To perform the navigator sequence NS, slope magnetic field Gx1 in the first x' direction is applied, as shown in FIG. 4, along with the first RF pulse RF1 having the flip angle of 90 degrees. The first RF pulse RF1 is transmitted to the subject SU so as to selectively excite at 90 degrees the first slice plane area S1 which is intersecting with the navigator area NA including the epiglottis, as shown in FIG. 5, which is out of the imaging area IA including esophagus in the subject SU. In other words, an inclined slice plane, which is not parallel to the body axis of the subject SU is selectively excited as the first slice plane area S1.

Then, as shown in FIG. 4, after a second slope magnetic field Gx2 in the x' direction is applied to the subject SU to move back the phases and a first slope magnetic field Gz1 in the z direction is applied, the first slope magnetic field Gy1 in y direction along with a second RF pulse RF2 having the flip angle of 180 degrees will be applied. In this example as shown in FIG. 5, the second RF pulse RF2 is emitted so as to excite at 180 degrees the second slice plane area S2, which is out of the imaging area IA including the esophagus in the subject SU and which is intersecting the first slice plane area S1 in the navigator area NA including the epiglottis. In other words, a slice plane that is not in parallel to the body axis of the subject SU and is inclined in the opposing direction to the first slice plane area S1 is to be selectively excited as the second slice plane area S2.

Then, a second gradient magnetic field Gz2 in z direction is applied so that the magnetic resonance signals MRI from the navigator area NA where the first slice plane area S1 and the second slice plane area S2 are intersecting each other in the subject SU will be obtained as the navigator echo data. Thus the magnetic resonance signals MRI obtained as the navigator echo data by the navigator sequence NS will be acquired by the data acquisition unit 24 to output to the body move detector unit 25.

Next, as shown in FIG. 2, the raw data is determined whether to be selected or not (S31).

For each scan, the imaging data obtained by the scan unit 2 performing the imaging sequence IS is determined whether to be selected or not as raw data by the raw data selector unit 26 based on the displacement caused by the body move of the subject SU detected by the body move detector unit 25.

In this preferred embodiment, the raw data selector unit 26 selects the imaging data as raw data based on the displacement N of epiglottis of the subject SU caused by the deglutition movement detected by the body move detector unit 25.

More specifically, the displacement N of epiglottis which has moved by the deglutition movement after the scan unit 2 performs the imaging sequence IS is determined by the body move detector unit 25, based on the navigator echo data obtained by the scan unit 2 performing the navigator sequence NS as stated above. In this example the navigator echo data undergoes the invert Fourier transform to generate a profile of the area including the epiglottis, from which profile the displacement N of the epiglottis is determined by the body move detector unit 25.

Then, the imaging data obtained by the imaging sequence IS performed before performing the navigator sequence NS, is determined by the raw data selector unit 26 whether or not to be selected as raw data, based on the displacement N determined by the body move detector unit 25 as have been described above. More specifically, the raw data selector unit 26 determines whether or not the displacement N of the epiglottis determined by the body move detector unit 25 is within the tolerable range AW.

As shown in FIG. 2, if the displacement of epiglottis N is not within the predefined allowable range AW (i.e., NO), then the magnetic resonance signals obtained as the imaging data in the imaging sequence IS of the scan S is not to be selected as raw data. As shown in FIG. 2, in such a case (NO), the imaging sequence IS (S11), and the navigator sequence NS (S21) are repeatedly performed again. In this embodiment, for example, the imaging sequence IS is performed again so as to accommodate the phase encoding step of the imaging sequence IS that has not been selected as raw data.

On the other hand, if the displacement of epiglottis N is within the allowable range AW (YES), then the magnetic resonance signals obtained as the imaging data in the imaging sequence IS of the scan S is selected as raw data.

When the epiglottis moves due to the deglutition movement to exceed the allowable range AW, the magnetic resonance signals obtained as the imaging data in the imaging sequence IS of the scan S is not selected as raw data; when the epiglottis does not move because the deglutition did not occur or does move within the allowable range AW, the magnetic resonance signals obtained as the imaging data in the imaging sequence IS of the scan S is selected as raw data.

More specifically, if the epiglottis fall down due to the deglutition movement to seal the tracheal airway, the signals will not be selected as raw data.

Next, the raw data will be saved as shown in FIG. 2 (S41).

The raw data selector unit 26 stores and saves the imaging data selected as raw data as have been described above.

Next, it is determined here whether the raw data acquisition is complete or not (S51).

The controller unit 30 determines whether the raw data selector unit 26 obtained all raw data in correspondence with the matrices of the slice image to be generated. For example, it determines whether the raw data has been obtained which corresponds to all of phase encoding steps in the k space. If the raw data selector unit 26 does not obtain all of raw data (NO), then the controller unit 30 will control components to continue the scan S of the subject SU described above.

On the other hand, if the raw data selector unit 26 obtained all of raw data (YES), as shown in FIG. 2, then the process will generate a slice image (S61).

From the imaging data selected as raw data by the raw data selector unit 26, a slice image for the slice plane including the esophagus of the subject SU is reconstructed by the image generator unit 31. Then the image generator unit 31 outputs thus reconstructed slice image to the display unit 33.

As can be seen from the foregoing, in the present embodiment, the scan unit 2 iteratively repeats the imaging sequence IS for obtaining as imaging data the magnetic resonance signals developed in the imaging area IA including the esophagus of the subject SU, and the navigator sequence NS for obtaining as navigator echo data the magnetic resonance signals developed in the navigator area NA including the epiglottis of the subject SU. When performing the navigator sequence NS, the scan unit 2 emits first RF pulse having the flip angle of 90 degrees so as to excite the first slice plane area S1 that is out of the imaging area IA and is intersecting with the navigator area NA in the subject SU. Then, it emits a second RF pulse having the flip angle of 180 degrees so as to excite the second slice plane area S2 that is out of the imaging area IA and is intersecting with the first slice plane area S1 of the navigator area NA. Then, based on the navigator echo data obtained by the scan unit 2 performing the navigator sequence NS, the body move detector unit 25 repeatedly detects the displacement of epiglottis in the navigator area NA due to the deglutition movement. The raw data selector unit 26 then selects as raw data the imaging data obtained by the scan unit 2 performing the imaging sequence IS based on the displacement of epiglottis of the navigator area NA detected by the body move detector unit 25. Based on the imaging data selected as raw data by the raw data selector unit 26, the image generator unit 31 generates a slice image of the slice plane including the esophagus in the subject SU. As can be seen from the foregoing, the present embodiment suppress the onset of body move artifacts developed by the body move within the subject SU such as the epiglottis which moves along with the deglutition movement, allowing improving the image quality. When performing the navigator sequence NS, since the scan unit 2 excites the first slice plane area S1 and the second slice plane area S2 so as to correspond to the area other than the imaging area IA, and the imaging data obtained in the imaging sequence IS is not affected by the RF interference from the navigator sequence NS, so that the image quality of the slice image generated based on the imaging data may be improved.

Second Embodiment

A second preferred embodiment in accordance with the present invention will be described herein below in greater details.

The present embodiment is similar to the preceding first preferred embodiment, except for the operation that the scan unit 2 performs the navigator sequence. The description of the similar operation to the first preferred embodiment will be omitted.

The operation of imaging the subject SU in this embodiment will be described in greater details.

When the present embodiment performs the scan S, it performs the imaging sequence IS as similar to the preceding first embodiment, as shown in FIG. 2 and FIG. 3 (S11).

Next, as shown in FIG. 2 and FIG. 3, it performs the navigator sequence NS (S21).

To monitor the deglutition movement of the subject SU, the scan unit 2 performs the navigator sequence NS for exciting selectively the spin in the navigator area NA including the epiglottis to obtain the magnetic resonance signals as navigator echo data.

Figure 6:
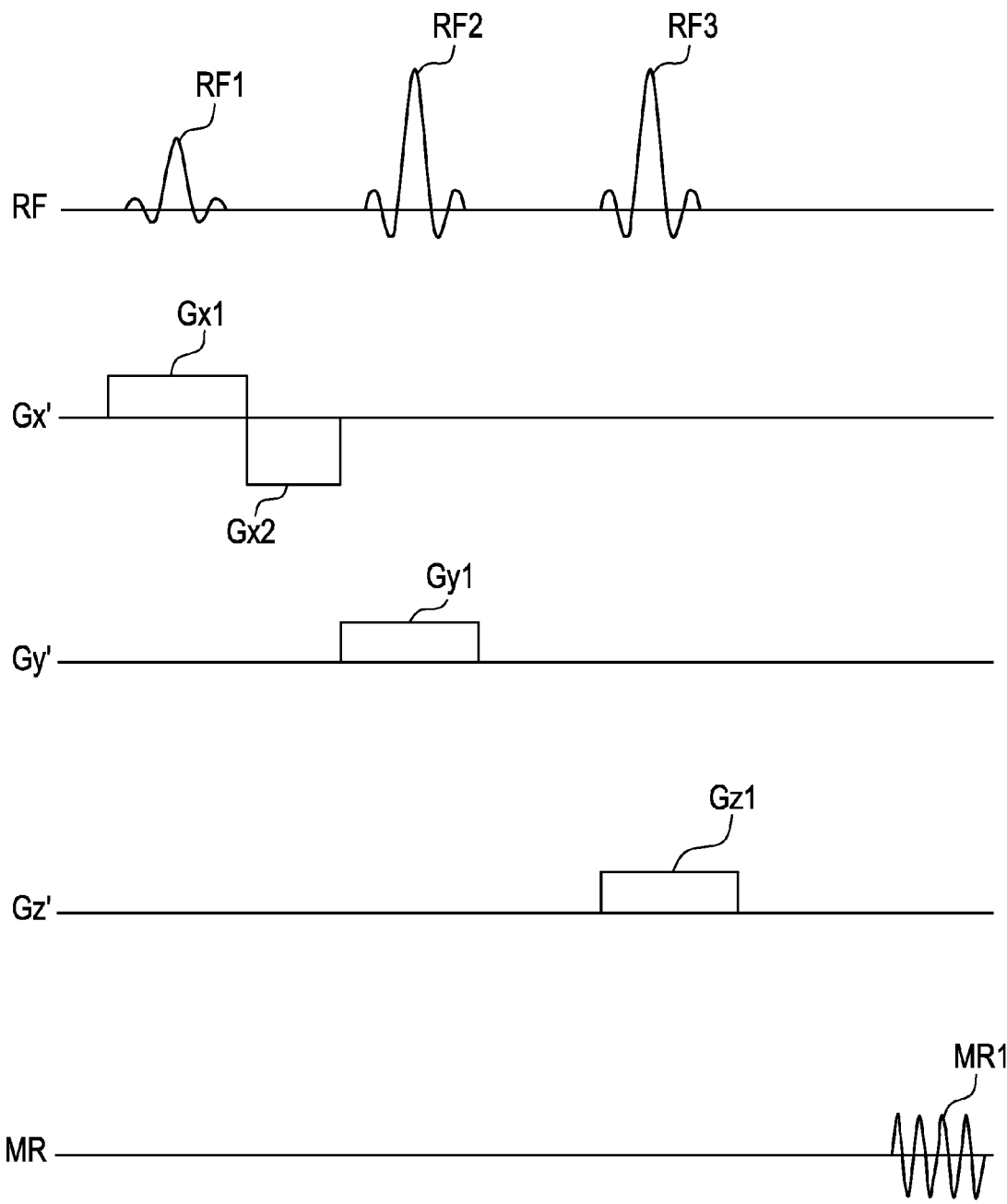
FIG. 6 is a schematic pulse sequence diagram illustrating the navigator sequence NS to be performed in second preferred embodiment of the present invention.

FIG. 6 shows a schematic diagram of pulse sequence indicating the navigator sequence NS performed in this preferred embodiment. In FIG. 6, RF pulse RF, gradient magnetic field in x' direction Gx', gradient magnetic field in z' direction Gz', gradient magnetic field in y' direction Gy' are shown. In the figure the ordinate indicates the intensity, the abscissa indicates the time axis. x', y', and z' directions are axial directions in the oblique coordinate system.

Figure 7A:
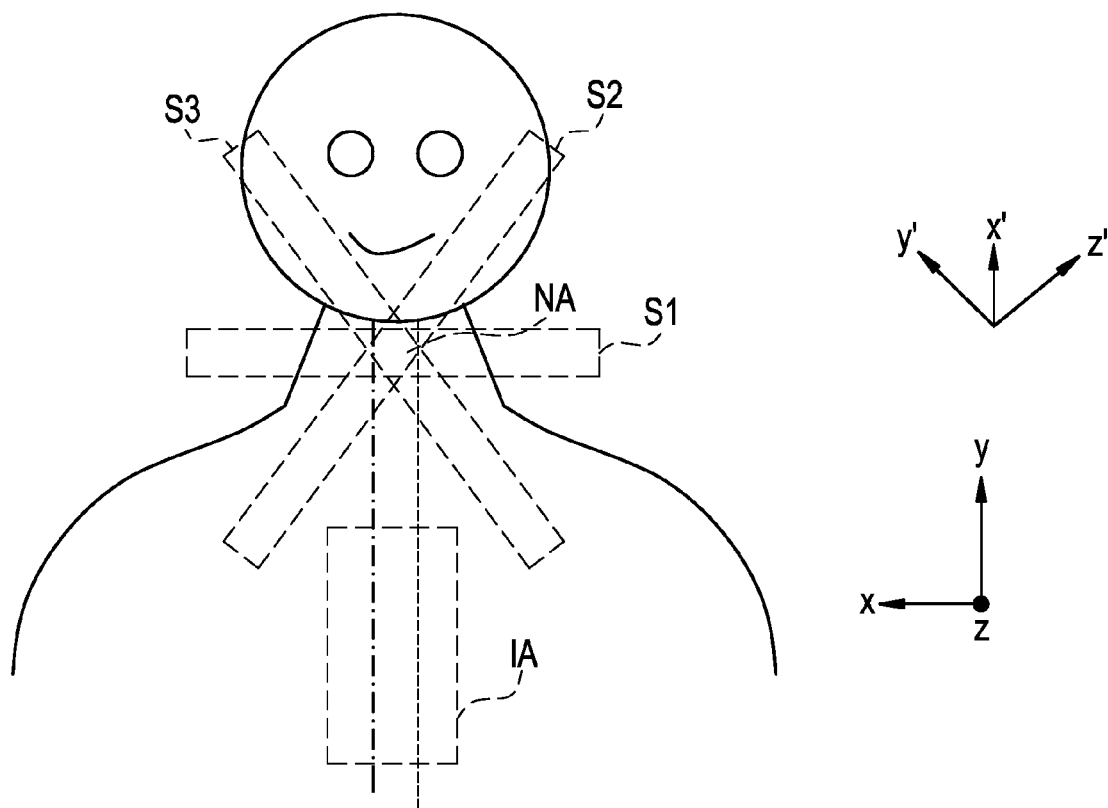
FIGS. 7a and 7b are schematic diagrams illustrating the operation of the navigator sequence NS of the subject SU in second preferred embodiment of the present invention.
Figure 7B:
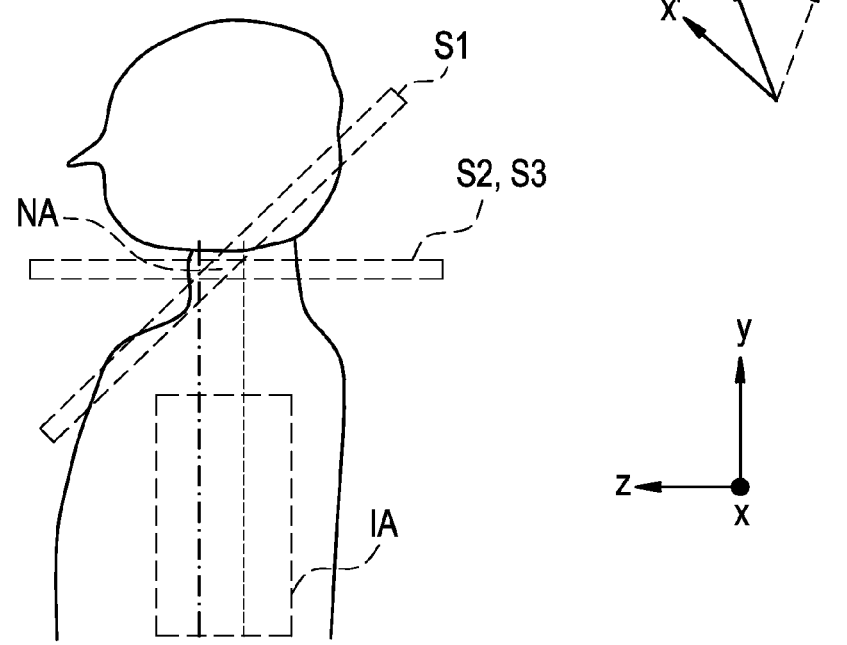

FIG. 7 shows a schematic diagram illustrating how to perform the navigator sequence NS on the subject SU. In FIG. 7, FIG. 7 (a) shows a front elevation of the subject SU, viewed from the line of sight in z direction, FIG. 7 (b) shows a side elevation of the subject SU viewed from the line of sight in x direction. It should be noted that x' direction in FIG. 7 (a) is the direction from the drawing toward the reader side, y' direction in FIG. 7 (b) is the direction from the drawing toward the thither side of paper, and z' direction is the direction from the drawing plane toward the reader side.

In the operation of navigator sequence NS, as shown in FIG. 6, slope magnetic field in x' direction Gx1 along with the first RF pulse RF1 having the flip angle of 90 degrees is applied. Then in the subject SU, as shown in FIG. 7, the first RF pulse RF1 is emitted so as to excite selectively at 90 degrees the first slice plane area S1 that is out of the imaging area IA including the esophagus and is intersecting with the navigator area NA including the epiglottis. More specifically, as shown in FIG. 7 (b), an slice plane that is not in parallel to the y direction which is the body axis direction of the subject SU and that is inclined to rotate in z direction around the axis of the navigator area NA is to be selectively excited as the first slice plane area S1.

Next, as shown in FIG. 6, after the phase is brought back by applying to the subject SU a second slope magnetic field in x' direction Gx2, a first slope magnetic field in y' direction Gy1 along with a second RF pulse RF2 having the flip angle of 180 degrees is applied. In this example, as shown in FIG. 7, the second RF pulse RF2 is emitted so as to excite at 180 degrees the second slice plane area S2 that is out of the imaging area IA including the esophagus in the subject SU and is intersecting with the first slice plane area S1 in the navigator area NA including the epiglottis. More specifically, as shown in FIG. 7 (a), a slice plane that is not in parallel to y direction which is the direction of body axis of the subject SU and that is inclined to rotate in x direction around the axis of the navigator area NA is selectively excited as the second slice plane area S2.

Then, as shown in FIG. 6, a first slope magnetic field in z' direction Gz1 along with a third RF pulse RF3 having the flip angle of 180 degrees is applied. In this embodiment as shown in FIG. 7, the third RF pulse RF3 is emitted so as to excite at 180 degrees the third slice plane area S3 that is out of the imaging area IA including the esophagus and that is intersecting with the first slice plane area S1 and the second slice plane area S2 in the navigator area NA including the epiglottis, in the subject SU. More specifically, as shown in FIG. 7 (a), the slice plane that is not in parallel to y direction which is the body axis direction of the subject SU and that is inclined so as to rotate in x direction around the axis of the navigator area NA in the opposing side to the second slice plane area S2 is selectively excited as the third slice plane area S3.

The magnetic resonance signals MRI from the navigator area NA where the first slice plane area S1 and the second slice plane area S2 and the third slice plane area S3 are intersecting in the subject SU is obtained as the navigator echo data. The magnetic resonance signals MRI thus obtained as the navigator echo data by the operation of the navigator sequence NS is acquired by the data acquisition unit 24 to output to the body move detector unit 25.

Next, as shown in FIG. 2, in a manner similar to the preceding first preferred embodiment of the present invention, the determination whether or not to select as raw data (S31), the storage of the raw data (S41), the determination whether the acquisition of raw data is complete (S51), and the generation of a slice image (S61) are sequentially performed.

As can be seen from the foregoing, in the present preferred embodiment of the present invention, when performing the navigator sequence NS, the scan unit 2 emits a first RF pulse having the flip angle of 90 degrees so as to excite the first slice plane area S1 that is out of the imaging area IA and is intersecting with the navigator area NA, in the subject SU. Then it emits the second RF pulse having the flip angle of 180 degrees so as to excite the second slice plane area S2 that is out of the imaging area IA and is intersecting with the first slice plane area S1 in the navigator area NA. Thereafter, it emits the third RF pulse having the flip angle of 180 degrees so as to excite the third slice plane area S3 that is out of the imaging area IA and is intersecting the first slice plane area S1 and the second slice plane area S2 in the navigator area NA. Then the displacement of epiglottis in the navigator area NA caused by the deglutition is detected by the body move detector unit 25, and the raw data selector unit 26 selects the imaging data obtained by performing the imaging sequence IS as raw data based on the displacement of epiglottis detected earlier. Then based on the imaging data selected as the raw data by the raw data selector unit 26, the image generator unit 31 will generate a slice image in the slice plane including the esophagus in the subject SU. The present embodiment as similar to the preceding first preferred embodiment, is capable of suppressing the onset of the body move artifacts developed by the internal body move of the subject SU such as the epiglottis that moves during the deglutition movement, allowing improving the image quality. When performing the navigator sequence NS in the present preferred embodiment, the navigator echo data is acquired from the navigator area NA which is comprised of a voxel in which the first slice plane area S1 and the second slice plane area S2 and the third slice plane area S3 are intersecting, instead of the navigator area NA in the form of line that two slice planes are crossing as in the preceding first preferred embodiment. The navigator echo data can be thereby suitably obtained from such a tiny area as the epiglottis, so that the image quality can be effectively improved.

The magnetic resonance imaging apparatus 1 in the above preferred embodiments corresponds to the magnetic resonance imaging apparatus in accordance with the present invention. The scan unit 2 in the above preferred embodiments corresponds to the scan unit in accordance with the present invention. The raw data selector unit 26 in the above preferred embodiment corresponds to the body move detector unit in accordance with the present invention. The raw data selector unit 26 in the above preferred embodiments corresponds to the raw data selector unit in accordance with the present invention. The image generator unit 31 in the above preferred embodiments corresponds to the image generator unit in accordance with the present invention. And the display unit 33 in the above preferred embodiments corresponds to the display unit in accordance with the present invention.

The present invention, when carrying out may adopt a variety of modification and changes, and should not be considered to be limited to the preferred embodiments described above.

Although in the preferred embodiments, the present invention has been described in which the scan unit 2 performs the navigator sequence so as to obtain the navigator echo data in the navigator area including the epiglottis in the subject SU, and the body move detector unit 25 detects the displacement due to the deglutition movement of the subject SU based on the navigator echo data thus detected, the present invention is not limited thereto, and is applicable to the detection of any other body moves.

For example, in the preferred embodiments although the present invention has been described that a plurality of intersecting slices of planes are first excited then the crossing area of the plurality of slice planes is used as the navigator area to perform the navigator sequence, the present invention should not be considered to be limited thereto. For instance, the a plurality of linear slices may be excited, and the crossing area of the plurality of linear slices may be used as navigator area to perform the navigator sequence. In other words, a pencil beam can be used to perform the navigator sequence.

Figure 8:
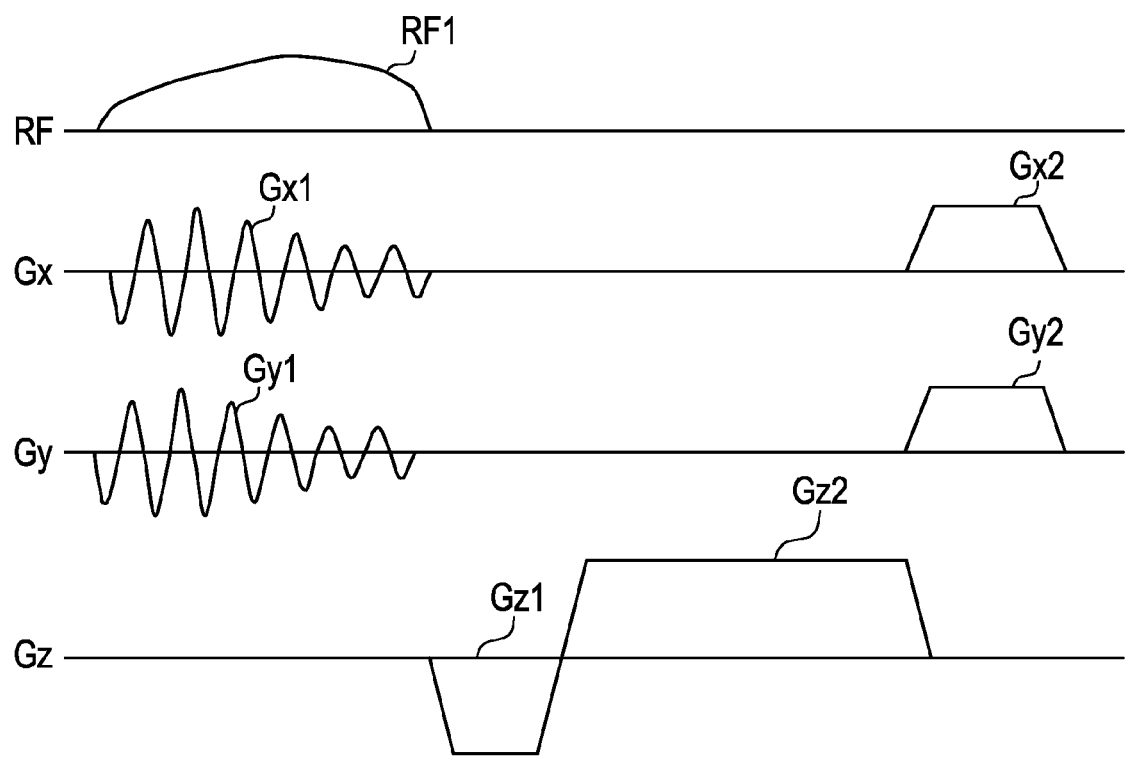
FIG. 8 is a schematic pulse sequence diagram illustrating the navigator sequence using a pencil beam in accordance with the present invention.

Now referring to FIG. 8 there is shown a schematic diagram of pulse sequence when performing the navigator sequence using a pencil beam.

As shown in FIG. 8, when transmitting the RF pulse RF the first gradient magnetic field in x direction Gx1 and first gradient magnetic field in y direction Gy1 are applied so as to gradually and alternately changes the polarity to select a slice on the subject in a linear shape. Then, as shown in FIG. 8, after applying the first gradient magnetic field in z direction Gz1 and second gradient magnetic field in z direction Gz2, the second gradient magnetic field in x direction Gx2 and second gradient magnetic field in y direction Gy2 are applied.

The navigator sequence can be performed using the pencil beam as have been described above.

In addition, for example in the preferred embodiments although the navigator sequence is described to be performed after the imaging sequence, the present invention is not limited thereto. For example, the navigator sequence can be performed before performing the imaging sequence. In such a case the imaging sequence can be controlled so as to be determined whether or not to be performed based on the navigator echo data obtained in the navigator sequence. More specifically, the imaging sequence may be controlled so as to be performed if the navigator echo data is within the allowable range. Furthermore, the navigator sequence can be performed both before and after the imaging sequence.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus for generating an image of a subject based on magnetic resonance signals developed in said subject by emitting RF pulses to said subject in a static magnetic field space, said magnetic resonance imaging apparatus comprising:

a scan unit for repeatedly performing an imaging sequence for obtaining said magnetic resonance signals developed in the imaging area of said subject as imaging data, and a navigator sequence for obtaining said magnetic resonance signals developed in the navigator area of said subject as navigator echo data;

a body move detector unit for repeatedly detecting the displacement of said navigator area caused by the body move, based on said navigator echo data obtained by said scan unit performing said navigator sequence;

a raw data selector unit for selecting said imaging data obtained by said scan unit performing said imaging sequence as raw data based on the displacement of said navigator area caused by the body move detected by said body move detector unit; and an image generator unit for generating the image of said subject based on said imaging data selected as raw data by said raw data selector unit, wherein said scan unit performs said navigator sequence, by emitting first RF pulse having the flip angle of 90 degrees to said subject so as to excite a first area including said navigator area, and then by emitting second RF pulse having the flip angle of 180 degrees so as to excite a second area that is intersecting with said first area in said navigator area.

2. A magnetic resonance imaging apparatus according to claim 1, wherein said scan unit performs said navigator sequence so as to excite the area out of said imaging area as said first area and said second area.

3. A magnetic resonance imaging apparatus according to claim 1, wherein said scan unit performs said navigator sequence by, after emitting said second RF pulse to said subject, emitting a third RF pulse having the flip angle of 180 degrees so as to excite a third area that is intersecting with said first area and said second area in said navigator area.

4. A magnetic resonance imaging apparatus according to claim 3, wherein
said scan unit performs said navigator sequence so as to excite the area other than said imaging area as said third area.

5. A magnetic resonance imaging apparatus according to claim 1, wherein
when said displacement is within a reference range, said raw data selector unit selects as raw data the imaging data corresponding to said displacement within said reference range.

6. A magnetic resonance imaging apparatus according to claim 1, wherein
said body move detector unit detects the displacement caused by the deglutition movement of said subject.

7. A magnetic resonance imaging apparatus according to claim 6, wherein
said scan unit performs said navigator sequence so as to obtain said navigator echo data for said navigator area including the epiglottis in said subject.

8. A magnetic resonance imaging apparatus according to claim 1, further comprising:
a display unit for displaying on a display screen an image of said subject generated by said image generator unit.

* * * * *